United States Patent [19]

Jeanguenin et al.

[11] 4,089,092
[45] May 16, 1978

[54] METHOD OF SUSPENDING ELECTRICAL COMPONENTS

[75] Inventors: Claude Jeanguenin, Delemont; Michel Jeannot, Neuchatel, both of Switzerland

[73] Assignee: Societe Suisse pour l'Industrie Horrlogere (SSIH) Management Services S.A., Bienne, Switzerland

[21] Appl. No.: 758,517

[22] Filed: Jan. 11, 1977

Related U.S. Application Data

[63] Continuation of Ser. No. 578,914, May 19, 1975, abandoned.

[51] Int. Cl.² .......................................... H01L 41/22
[52] U.S. Cl. .................................... 29/25.35; 29/628; 228/165; 228/173 E; 228/254; 310/352
[58] Field of Search ............... 29/25.35, 628, 630 R, 29/630 A; 310/8.2, 9.4, 9.1; 228/165, 173, 253, 254, 255; 174/94 R

[56] References Cited

U.S. PATENT DOCUMENTS

| | | | |
|---|---|---|---|
| 3,791,019 | 2/1974 | Schmidt | 228/254 |
| 3,794,867 | 2/1974 | Gibert et al. | 310/8.2 X |

FOREIGN PATENT DOCUMENTS 7,782/1970  3/1970  Japan .......................... 310/9.1

*Primary Examiner*—Carl E. Hall
*Attorney, Agent, or Firm*—Griffin, Branigan and Butler

[57] ABSTRACT

This invention concerns a method of suspending electrical components such as piezoelectric resonators, as well as the suspension members themselves. An electrically conductive lead is provided with at least one protuberance in the form of a hollow cone transverse to the length thereof. The end of the cone is pierced or cut off and the cone is provided with a soldering alloy. The conductive lead is placed adjacent the component so that the tip of the cone is in contact with the surface of the component at a desired location and heat is applied so that the solder fuses and flows through the tip by capillary action thereby effecting a soldered joint.

8 Claims, 19 Drawing Figures

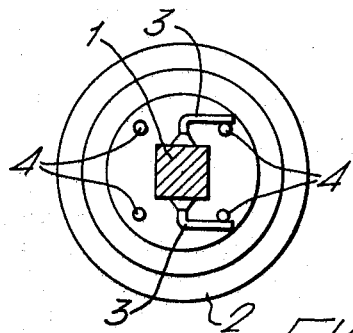
FIG. 1a. PRIOR ART
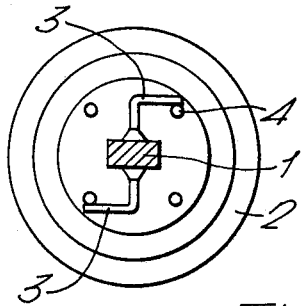
FIG. 1b. PRIOR ART
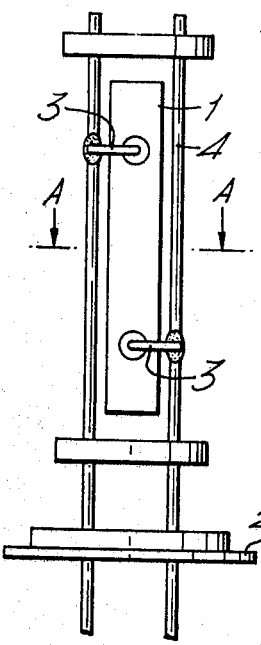
FIG. 1c PRIOR ART
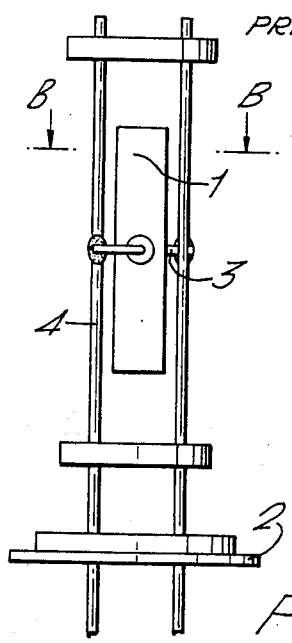
FIG. 1d PRIOR ART
FIG. 2a.   FIG. 2b.
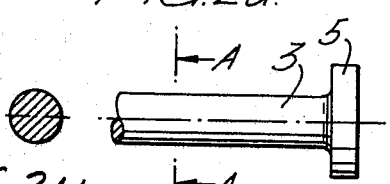
FIG. 2AA   FIG. 2BB
FIG. 2c.
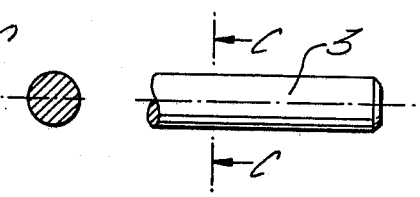
FIG. 2CC

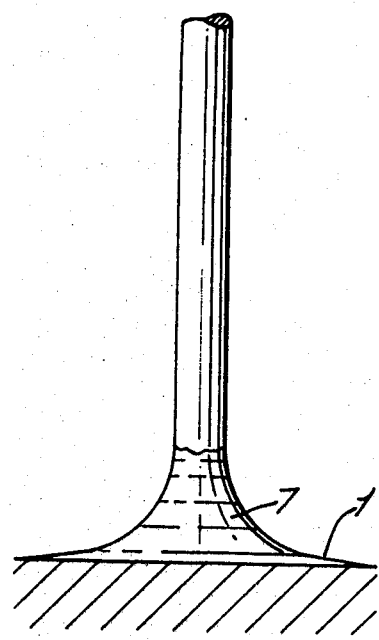
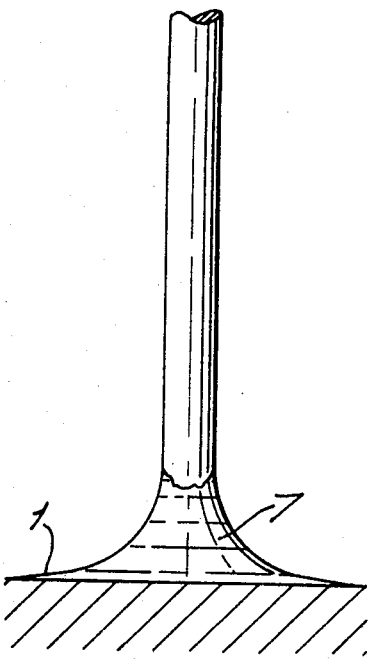
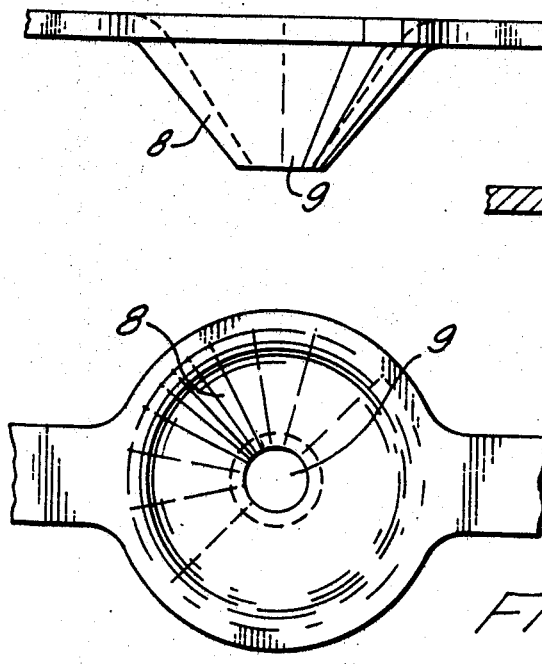
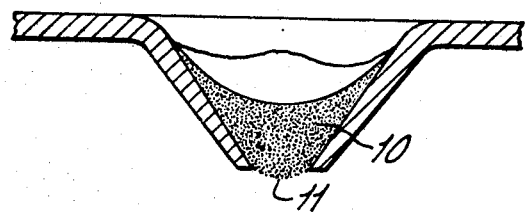

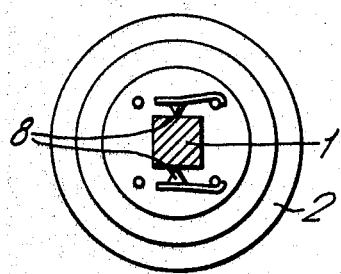
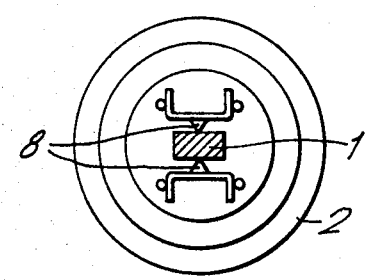
FIG.6a.  FIG.6b.
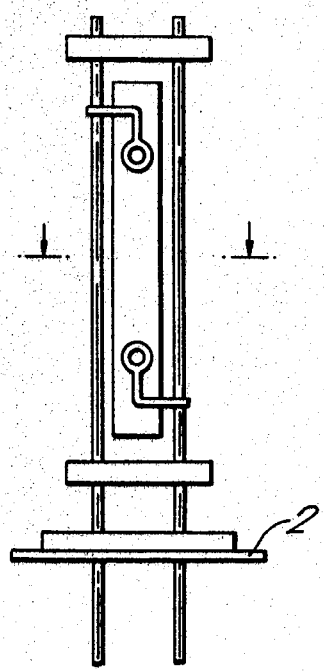
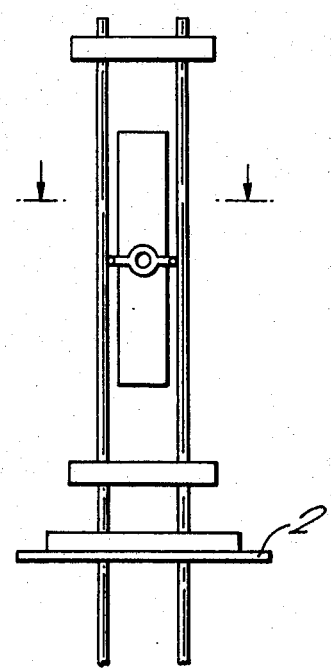
FIG.6c  FIG.6d

METHOD OF SUSPENDING ELECTRICAL COMPONENTS

This is a continuation of application Ser. No. 578,914, filed May 19, 1975, now abandoned.

BACKGROUND OF THE INVENTION

Although not intended to be confined to a suspension of piezoelectric resonators the invention arose through the problem associated with the connection of such resonators to electrically conductive supporting leads. Such resonators in general have been elastically supported by means of wires or thin ribbons for which the purpose is to assure an assembly which will resist forces arising from shocks due to acceleration generally encountered in applications such as in quartz timepieces, and at the same time to achieve the necessary electrical connections.

In most cases the attachment points of such leads must be located with considerable precision and normally correspond to places where vibration amplitudes are at a minimum. Such places are often determined by calculation and may be in the form of points which in fact correspond to nodal points.

In certain resonators operating at high frequencies, however, such places may be in the form of points, lines or surfaces in accordance with the type of resonator.

One currently used method for fastening the ends of the leads to the surface of the resonator is to use a welding or brazing alloy having a low fusion temperature. The extremity of the lead may in certain cases exhibit a flattened zone although this may not be necessarily the case. Herein the brazing or soldering alloy is applied as a wire or preform, and a soldering or brazing operation is effected by means of an appropriate heat source with or without the aid of a chemical fluxing agent.

In practice it is found that the dimensions fo the fastening vary according to the quantity of alloy utilized, the type of flux, the heating time, the quality of the surfaces and their degree of cleanliness. Under optimum conditions for the obtaining of a good joint the alloy shows a certain tendency to spread itself over the metallized surface of the resonator and it may be said that such alloy wets the surface.

The presence of this soldering or brazing alloy around the nodal points will influence in a negative fashion the resonator performance in view of the increase of the mass and the loss of energy due to internal friction in this mechanically imperfect material. Furthermore, the quantity of soldering or brazing alloy used for each operation is not uniform when such is applied in the form of a wire. Although preforms may eliminate this difficulty they are difficult to retain in place during the operation.

Accordingly, the purpose of the invention is to provide a method for suspending electrical components such as piezoelectric resonators, by means of electrically conducting leads in a manner to eliminate difficulties hitherto encountered.

A further object of the invention is to provide leads which will enable the improved suspension method to be applied in an industrially economic fashion.

SUMMARY OF THE INVENTION

The invention accordingly provides a method of suspending electrical components by electrically conducting leads comprising the steps of:

(a) forming at least one hollow cone-like protuberance in the material of the leads transverse to the length thereof, (b) piercing or removing the pointed end of said protuberance thereby to provide a funnel, (c) utilizing the funnel to retain a soldering alloy, (d) placing the leads adjacent the components so that the pointed ends of the funnels are applied to the surface of the components at desired locations and (e) heating the funnels sufficiently to cause fusion and capillary flow of the soldering alloy at said surface thereby achieving soldered points.

The invention further provides a suspension element for an electrical component comprising an elongated member in the form of a wire or ribbon of malleable electrically conducting material, at least one hollow cone-like protuberance formed at a preselected location in said member and in a direction transverse to the length thereof, said protuberance having the pointed end thereof pierced and being provided with a predetermined quantity of soldering alloy.

As previously indicated the electrical component may take the form of a piezoelectric resonator, however, the invention might equally be applied to other electrical components where high precision is desirable in the fixing and suspension thereof as for example integrated circuits.

BRIEF DESCRIPTION OF THE DRAWINGS

FIGS. 1a and 1b are sectional views of FIGS. 1c and 1d, respectively.

FIGS. 1c and 1d show prior art forms of suspension within a support as applied to piezoelectric resonators.

FIG. 2a, 2b and 2c show three forms of the end of a suspension lead as would be applied to the surface of a resonator according to the prior art. FIGS. 2aa, 2bb, and 2cc are sectional views of FIGS. 2a, 2b, and 2c, respectively.

FIG. 3a and 3b show forms of joints obtained utilizing the prior art methods.

FIG. 4 and 4a show respectively a section and plan view of a suspension lead after forming thereof according to the invention.

FIG. 5 is a cross section of the lead following the addition of brazing or soldering alloy.

FIGS. 6a and 6b are sectional views of FIGS. 6c and 6d, respectively.

FIGS. 6c and 6d show piezoelectric resonators mounted in their supports in accordance with the teaching of this invention.

DETAILED DESCRIPTION OF THE INVENTION

FIGS. 1a–1d show piezoelectric resonator elements 1 attached to a support 2 by means of electrically conductive leads 3 fixed within a cage provided by wires 4.

Details of the leads 3 in accordance with the prior art are shown in FIGS. 2a 2aa, 2b 2bb and 2c and 2cc in which it will be noted FIG. 2a provides a lead having a flattened end 5, FIG. 2b shows a ribbonlike lead having a turned up end 6 while FIG. 2c is simply a wire.

FIGS. 3a and 3b show the form of joint 7 obtained through use of these prior art lead conductors. Here it will be seen that the brazing or soldering material 7 is spread out considerably over the surface of the resonator 1 and as previously indicated such spreading may negatively affect the performance of the resonator.

To overcome these prior art difficulties this invention utilises a wire or ribbon wherein a portion of such wire or ribbon intended to be fastened to the surface of the electrical component is provided by any known forming means with a depression or protuberance in the form of a hollow cone-like portion 8. The tip of the cone 9 is pierced or cut off so that the overall effect is that of a funnel.

This funnel is next provided with a predetermined quantity of soldering or brazing alloy as shown at 10 in FIG. 5. The axis of the cone or funnel as shown in the drawings should be arranged so that, as shown it will be transverse to the length of the wire or ribbon. The cone or funnel portion may be then heated to the point of fusion of the alloy which will spread out over the internal surface of the funnel, but will be retained therein owing to the capillary effect. As shown in FIG. 5 a meniscus 11 will be formed at the tip of the funnel.

Following cooling of the arrangement there will now be available a suspension lead provided with a support surface having therein a precise quantity of alloy and which may be easily manipulated without risk of loosing the alloy.

The final assembly is now made and the same form of cage and support as shown in FIGS. 1a and 1b may be again utilized. As illustrated in FIGS. 6a-6d the resonator 1 is brought to its correct position with the funnels 8 applied substantially perpendicular to the surface thereof. The assembly is then completed by reheating the funnel which may be effected through use of a jet of hot gas, of an infrared radiation or by means of a soldering iron.

Although as previously indicated the soldering or brazing alloy may conveniently be applied to the funnels prior to the final assembly of the electrical component it is evident that this could equally be applied during the final assembly and there would thus be only a single heating operation.

What we claim is:

1. Method of suspending electrical components by electrically conducting leads comprising the steps of:
   forming at least one hollow cone-like protuberance in the material of the leads transverse to the length thereof;
   forming an opening in the apex end of said protuberance thereby to provide a funnel,
   placing a predetermined quantity of a soldering alloy in said funnel,
   heating said funnel to fuse said soldering alloy to said funnel, said soldering alloy filling said apex end and completely closing said opening while being retained in said funnel by capillary effect,
   allowing said funnel to cool until said soldering alloy has solidified;
   placing the leads adjacent the components so that the apex ends of the funnels are applied to the surface of the components at desired locations and
   heating the funnels sufficiently to cause fusion and capillary flow of the soldering alloy at said surface thereby soldering said leads to said resonator with the soldering alloy from said funnel.

2. Method as set forth in claim 1 wherein the soldering alloy is applied to the funnels following application of said funnels to the surface of the component and during heating of said funnels.

3. Method as set forth in claim 1 wherein heating is provided by a jet of heated gas.

4. Method as set forth in claim 1 wherein heating is provided by radiant means.

5. Method as set forth in claim 1 wherein heating is provided by a soldering iron.

6. Method of suspending a piezoelectric resonator by electrically conducting leads comprising the steps of:
   forming at least one hollow cone-like protuberance in the material of the leads transverse to the length thereof and at a predetermined location therealong,
   forming an opening in the apex end of said protuberance thereby to provide a funnel,
   placing a predetermined quantity of soldering alloy in the funnel,
   heating said funnel to fuse said soldering alloy to said funnel, said soldering alloy filling said apex end and completely closing said opening while being retained in said funnel by capillary effect,
   allowing said funnel to cool until said soldering alloy has solidified,
   placing the leads adjacent the resonator so that the apex ends of the funnels are in contract with the resonator surface at the nodal points thereof, and,
   heating the funnels sufficiently to cause fusion and capillary flow of the soldering alloy at said surface thereby soldering said leads to said resonator.

7. The method of claim 6 wherein said soldering alloy filling said apex end and closing said opening forms a meniscus at the opening.

8. The method of claim 1 wherein said soldering alloy filling said apex end and closing said opening forms a meniscus at said opening.

* * * * *